(12) United States Patent
Zhang et al.

(10) Patent No.: US 10,833,021 B2
(45) Date of Patent: Nov. 10, 2020

(54) METHOD FOR PRECISELY ALIGNING BACKSIDE PATTERN TO FRONTSIDE PATTERN OF A SEMICONDUCTOR WAFER

(71) Applicant: Alpha and Omega Semiconductor (Cayman) Ltd., Grand Cayman (KY)

(72) Inventors: Lei Zhang, Portland, OR (US);
Hongyong Xue, Portland, OR (US);
Jian Wang, Portland, OR (US); Runtao Ning, Hillsboro, CA (US)

(73) Assignee: ALPHA AND OMEGA SEMICONDUCTOR (CAYMAN) LTD., Grand Cayman (KY)

(*) Notice: Subject to any disclaimer, the term of this patent is extended or adjusted under 35 U.S.C. 154(b) by 0 days.

(21) Appl. No.: 16/009,144

(22) Filed: Jun. 14, 2018

(65) Prior Publication Data
US 2019/0006285 A1    Jan. 3, 2019

Related U.S. Application Data

(63) Continuation-in-part of application No. 15/637,361, filed on Jun. 29, 2017, now Pat. No. 10,170,559, and
(Continued)

(51) Int. Cl.
*H01L 23/544*  (2006.01)
*H01L 21/67*  (2006.01)
(Continued)

(52) U.S. Cl.
CPC ...... *H01L 23/544* (2013.01); *H01L 21/67282* (2013.01); *H01L 21/6835* (2013.01);
(Continued)

(58) Field of Classification Search
CPC ......... H01L 23/544; H01L 2223/54426; H01L 2223/54453; H01L 21/6835;
(Continued)

(56) References Cited

U.S. PATENT DOCUMENTS 5,414,290 A    5/1995    Bauer
5,952,694 A *  9/1999    Miyawaki ........... H01L 21/2007
                                              257/347

(Continued)

OTHER PUBLICATIONS

F.G.C. Bijnen, W.V. Buel, M. Young, X. Zhou, C. Gooch, Back-side alignment strategy decouples process from alignment and achieves leading edge overlay performance, Microelectronic Engineering, vol. 83, Issues 4-9, 2006, pp. 647-650, ISSN 0167-9317 (Year: 2006).*

(Continued)

*Primary Examiner* — Mohammed Shamsuzzaman
*Assistant Examiner* — Aaron J Gray
(74) *Attorney, Agent, or Firm* — Chen-Chi Lin (57) ABSTRACT

A method comprises the steps of providing a semiconductor device wafer; forming a first plurality of alignment marks on a first side of the semiconductor device wafer; forming a first pattern of a first conductivity type; forming a second plurality of alignment marks on a second side of the semiconductor device wafer; forming a bonded wafer by bonding a carrier wafer to the semiconductor device wafer; forming a third plurality of alignment marks on a free side of the carrier wafer; applying a grinding process; forming a plurality of device structure members; removing the carrier wafer; applying an implanting process and an annealing process; applying a metallization process and applying a singulation process.

14 Claims, 7 Drawing Sheets

Related U.S. Application Data a continuation-in-part of application No. 15/637,352, filed on Jun. 29, 2017, now abandoned.

(51) Int. Cl.

| | |
|---|---|
| *H01L 21/683* | (2006.01) |
| *H01L 21/304* | (2006.01) |
| *H01L 21/265* | (2006.01) |
| *H01L 21/78* | (2006.01) |
| *H01L 29/66* | (2006.01) |

(52) U.S. Cl.
CPC .......... *H01L 21/265* (2013.01); *H01L 21/304* (2013.01); *H01L 21/78* (2013.01); *H01L 29/66325* (2013.01); *H01L 2221/6835* (2013.01); *H01L 2221/68309* (2013.01); *H01L 2221/68327* (2013.01); *H01L 2221/68381* (2013.01); *H01L 2223/54426* (2013.01); *H01L 2223/54453* (2013.01)

(58) Field of Classification Search
CPC ... H01L 2221/68327; H01L 2221/6835; H01L 2221/683; H01L 21/304; H01L 21/30625
USPC ......................................... 438/401, 455, 459
See application file for complete search history.

(56) References Cited

U.S. PATENT DOCUMENTS

| | | | |
|---|---|---|---|
| 7,538,412 B2 | 5/2009 | Schulze et al. | |
| 7,910,486 B2 | 3/2011 | Yilmaz et al. | |
| 8,003,502 B2 | 8/2011 | Mauder et al. | |
| 8,084,814 B2 | 12/2011 | Nemoto et al. | |
| 8,148,749 B2 | 4/2012 | Grebs et al. | |
| 8,299,494 B2 | 10/2012 | Yilmaz et al. | |
| 8,653,556 B2 | 2/2014 | Niedernostheide et al. | |
| 9,129,851 B2 | 9/2015 | Kouno et al. | |
| 9,825,023 B2 | 11/2017 | Basler et al. | |
| 2013/0149836 A1* | 6/2013 | Wang ................ | H01L 21/30625 438/401 |
| 2013/0328105 A1* | 12/2013 | Matsuura ........... | H01L 29/0696 257/139 |
| 2014/0027814 A1 | 1/2014 | Pfirsch | |
| 2015/0214055 A1* | 7/2015 | Blanchard .......... | H01L 29/0619 438/548 |
| 2015/0228723 A1 | 8/2015 | Werber et al. | |
| 2015/0236142 A1 | 8/2015 | Laven et al. | |
| 2015/0325440 A1 | 11/2015 | Schulze et al. | |
| 2016/0093690 A1 | 3/2016 | Falck et al. | |
| 2016/0111415 A1 | 4/2016 | Basler et al. | |
| 2016/0197143 A1 | 7/2016 | Naito | |
| 2016/0211257 A1 | 7/2016 | Yoshida | |
| 2016/0284803 A1 | 9/2016 | Baburske et al. | |
| 2016/0322472 A1 | 11/2016 | Schloegl et al. | |

OTHER PUBLICATIONS

Matthias et al. 1.7kV High-Power IGBT Fabrication by Bonded-Water-Concept. Proceedings of the 27th International Symposium on Power Semiconductor Devices & IC's May 10-14, 2015, Kowloon Shangri-La , Hongkong.

\* cited by examiner

METHOD FOR PRECISELY ALIGNING BACKSIDE PATTERN TO FRONTSIDE PATTERN OF A SEMICONDUCTOR WAFER

CROSS-REFERENCE TO RELATED APPLICATIONS

This Patent Application is a Continuation in Part (CIP) Application of a pending application Ser. No. 15/637,352 filed on Jun. 29, 2017 by having a common inventor. This Patent Application is a Continuation in Part (CIP) Application of a pending application Ser. No. 15/637,361 filed on Jun. 29, 2017 by having a common inventor. The Disclosure made in the patent application Ser. No. 15/637,352 and patent application Ser. No. 15/637,361 are hereby incorporated by reference.

FIELD OF THE INVENTION

This invention relates generally to a method of fabricating semiconductor devices by precisely aligning backside pattern to frontside pattern of a semiconductor wafer. More particularly, the present invention relates the method referencing three or more sets of alignment marks.

BACKGROUND OF THE INVENTION

Fabrication of a reverse conducting insulated-gate bipolar transistor (RC-IGBT) requires N and P alternating patterns on a backside of a silicon wafer. The backside pattern is not precisely aligned with a frontside pattern because the silicon wafer faces down (the frontside pattern is not accessible) during a backside patterning process. A conventional fabrication method using a notch on the silicon wafer introduces large alignment errors (in the order of 20 microns) between the backside pattern and the frontside pattern.

The present disclosure references three or more sets of alignment marks. The alignment accuracy is improved and can be as good as a solely frontside process only. For example, the misalignment is less than 120 nanometers by using an i-line stepper and the misalignment is less than 60 nanometers by using a DUV stepper.

Because of the improved alignment, the present disclosure can be applied to fabrication of semiconductor devices having complicated device structure members requiring tight tolerances. The present disclosure can also be applied to a metal pattern etching process at the backside requiring precise alignment to the frontside.

SUMMARY OF THE INVENTION

The present invention discloses a method for fabricating semiconductor devices. The method comprises the steps of providing a semiconductor device wafer; forming a first plurality of alignment marks on a first side of the semiconductor device wafer; forming a first pattern of a first conductivity type; forming a second plurality of alignment marks on a second side of the semiconductor device wafer; forming a bonded wafer by bonding a carrier wafer to the semiconductor device wafer; forming a third plurality of alignment marks on a free side of the carrier wafer; applying a grinding process; forming a plurality of device structure members; removing the carrier wafer; applying an implanting process and an annealing process; applying a metallization process and applying a singulation process.

The step of bonding the carrier wafer to the semiconductor device wafer facilitates handling of the thinned semiconductor device wafer.

DETAILED DESCRIPTION OF THE INVENTION

Figure 1:
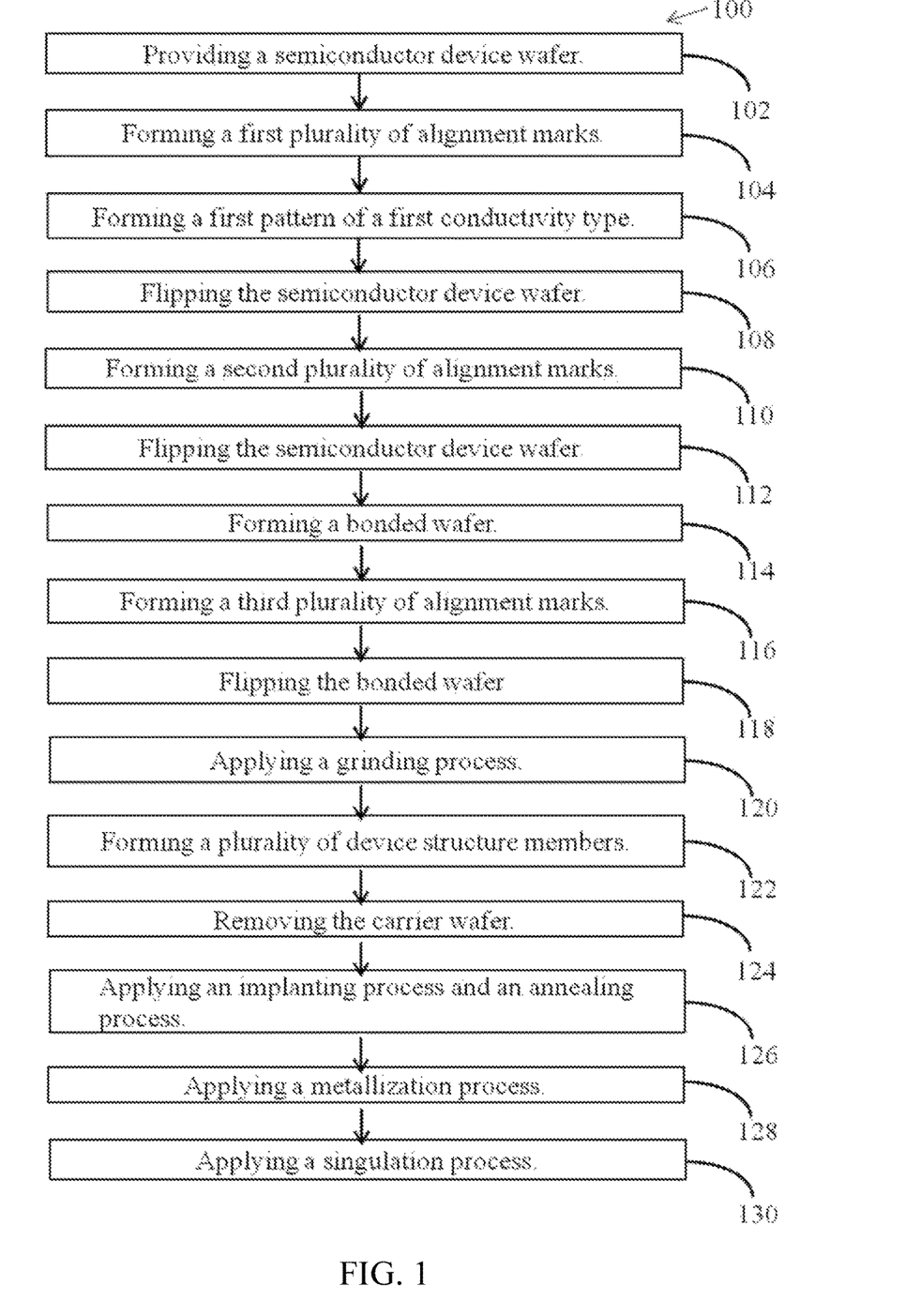
FIG. 1 is a flowchart of a process to fabricate a semiconductor device in examples of the present disclosure.

FIG. 1 is a flowchart of a process 100 to fabricate a semiconductor device in examples of the present disclosure. The process 100 may begin in block 102.

Figure 2A:
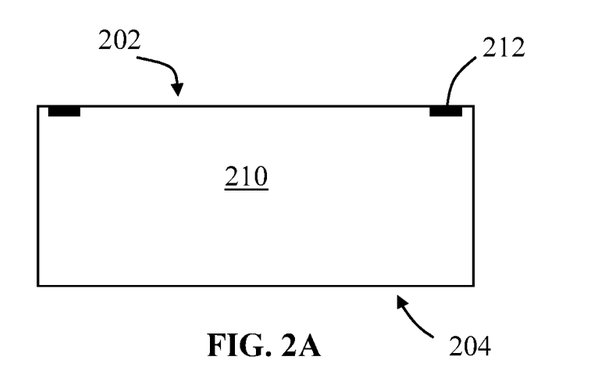
FIGS. 2A, 2B, 2C, 2D, 2E, 2F, 2G, 2H, 2I, 2J, 2K, 2L, 2M, 2N and 2O show cross sectional views of steps of the process to fabricate the semiconductor device of FIG. 1 in examples of the present disclosure.

In block 102, a semiconductor device wafer 210 of FIG. 2A is provided. In one example, the semiconductor device wafer 210 is a silicon wafer of 8-inch diameter and 725 μm thickness. In another example, the semiconductor device wafer 210 is a silicon wafer of 12-inch diameter and 775 μm thickness. In examples of the present disclosure, the semiconductor device wafer 210 is a monocrystalline Czochralski silicon (Cz) wafer, a magnetic field applied Cz (MCZ) wafer, a floating zone silicon (FZ) wafer, or an epitaxial (EPI) wafer. The semiconductor device wafer 210 has a first side 202 (for example, frontside) and a second side 204 (for example, backside). The second side 204 opposites the first side 202. Block 102 may be followed by block 104.

In block 104, a first plurality of alignment marks 212 of FIG. 2A are formed on the first side 202 of the semiconductor device wafer 210. Block 104 may be followed by block 106.

Figure 2B:
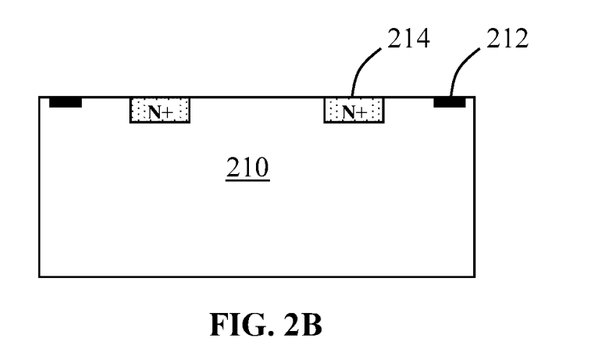

In block 106, a first pattern 214 of FIG. 2B of a first conductivity type (for example, N+) is formed on the first side 202 of the semiconductor device wafer 210 by referencing the first plurality of alignment marks 212. Block 106 may be followed by block 108.

Figure 2C:
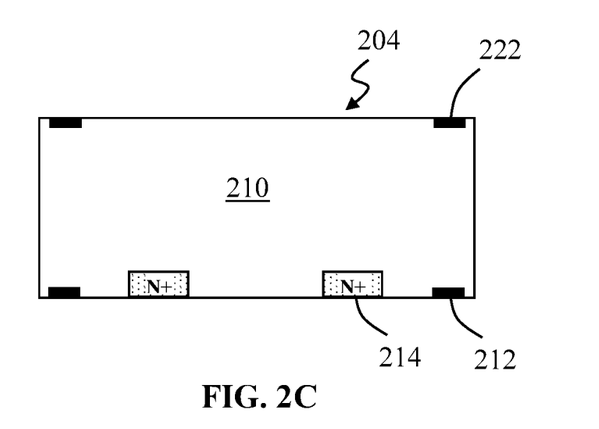

In block 108, the semiconductor device wafer 210 of FIG. 2C is flipped. Block 108 may be followed by block 110.

In block 110, a second plurality of alignment marks 222 of FIG. 2C are formed on the second side 204 of the semiconductor device wafer 210 by referencing the first plurality of alignment marks 212.

In examples of the present disclosure, ASML 3DALIGN™ product for three dimensional alignment is used to align the second plurality of alignment marks 222 of FIG. 2C to the first plurality of alignment marks 212. Block 110 may be followed by block 112.

Figure 2D:
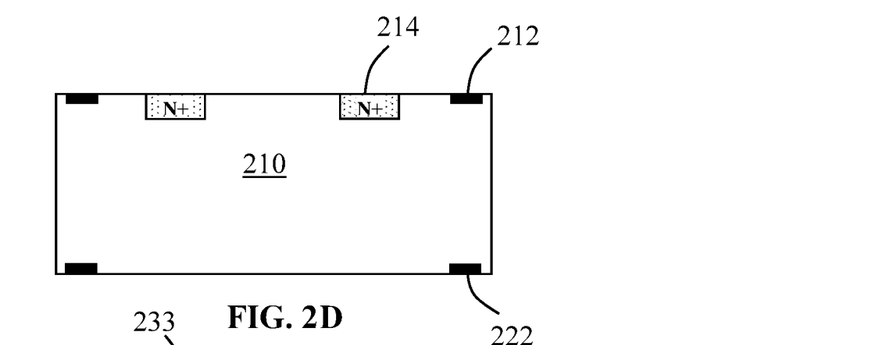

In block 112, the semiconductor device wafer 210 of FIG. 2D is flipped. Block 112 may be followed by block 114.

Figure 2E:
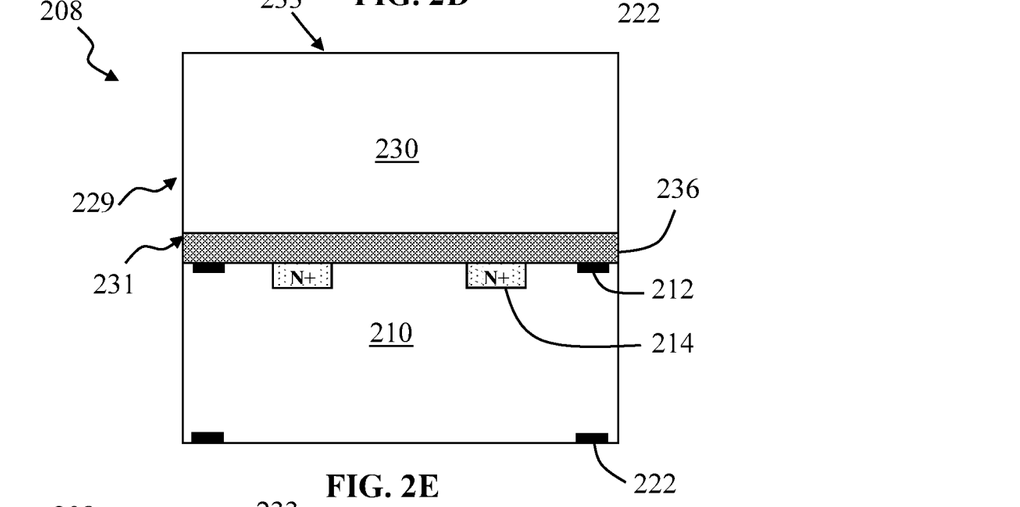

In block 114, a bonded wafer 208 of FIG. 2E is formed by bonding a carrier wafer 229 to the first side 202 of the semiconductor device wafer 210. The carrier wafer 229 has a bonded side 231 and a free side 233.

Figure 3A:
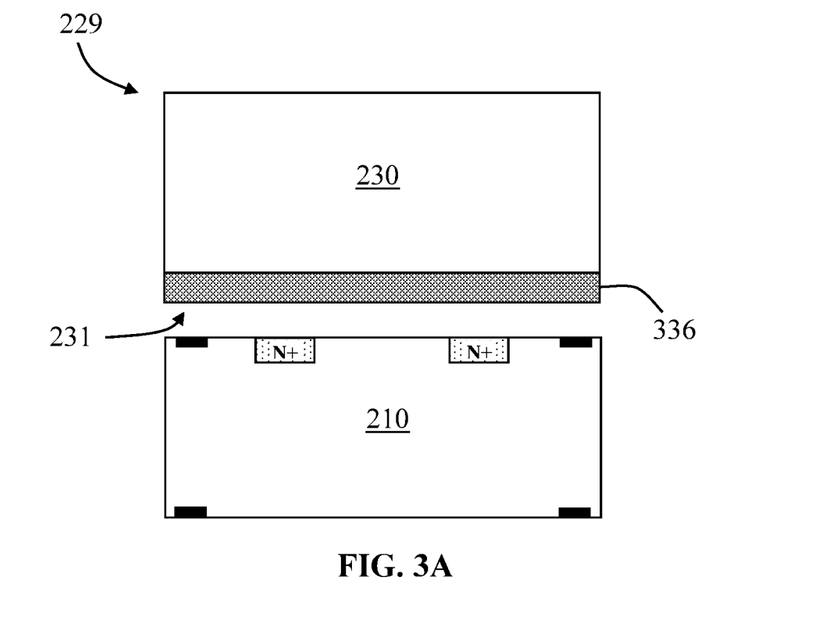
FIGS. 3A and 3B are exploded, cross sectional views of two bonded wafers respectively in examples of the present disclosure.

In one example, the carrier wafer 229 has a silicon substrate 230 of FIG. 3A and a silicon oxide layer 336 of FIG. 3A. The silicon oxide layer 336 is located at the bonded side 231 of the carrier wafer 229. The bonded wafer 208 is formed by bonding the silicon oxide layer 336 of the carrier wafer 229 to the first side 202 of the semiconductor device wafer 210 (in one example, made of silicon). The silicon oxide layer 236 of FIG. 2E contains solely the silicon oxide layer 336 of FIG. 3A.

Figure 3B:
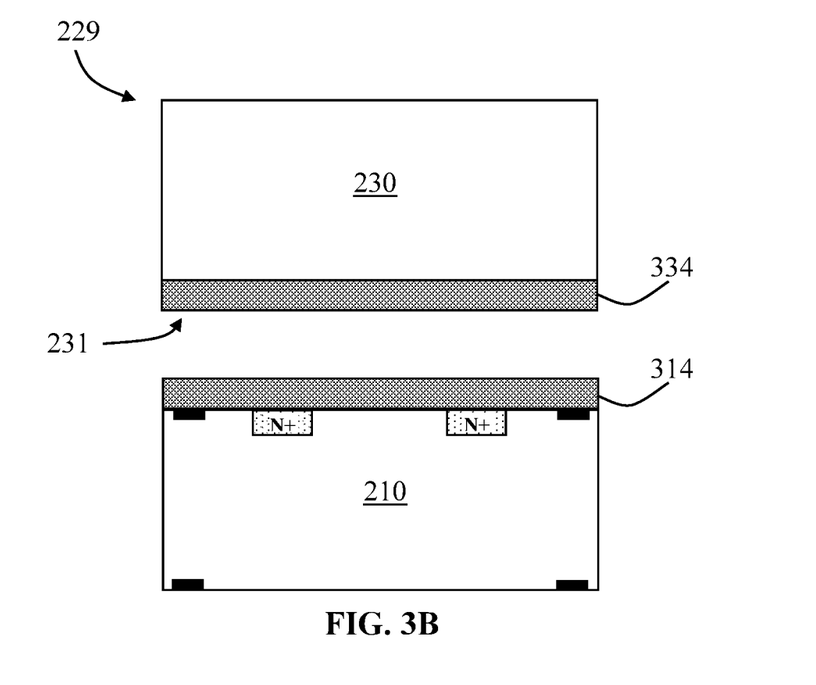

In another example, a silicon oxide layer 314 of FIG. 3B is grown and is directly attached to the first side 202 of the semiconductor device wafer 210. The carrier wafer 229 has a silicon substrate 230 of FIG. 3B and a silicon oxide layer 334 of FIG. 3B. The silicon oxide layer 334 is located at the bonded side 231 of the carrier wafer 229. The bonded wafer 208 is formed by bonding the silicon oxide layer 334 of the carrier wafer 229 to silicon oxide layer 314. The silicon oxide layer 236 of FIG. 2E contains the silicon oxide layer 314 and the silicon oxide layer 334 of FIG. 3B. Block 114 may be followed by block 116.

Figure 2F:
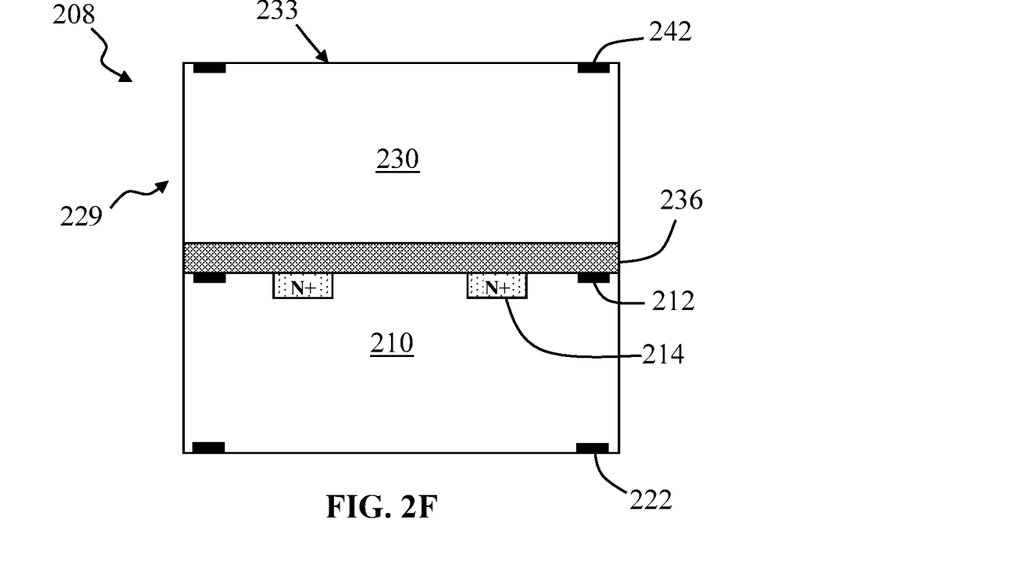

In block 116, a third plurality of alignment marks 242 of FIG. 2F are formed on the free side 233 of the carrier wafer 229 by referencing the second plurality of alignment marks 222. Block 116 may be followed by block 118.

Figure 2G:
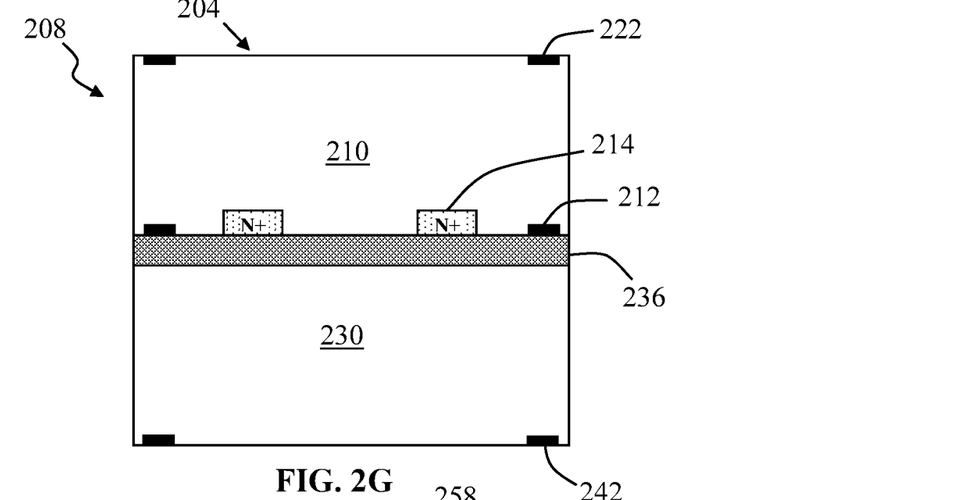

In block 118, the bonded wafer 208 of FIG. 2G is flipped. Block 118 may be followed by block 120.

Figure 2H:
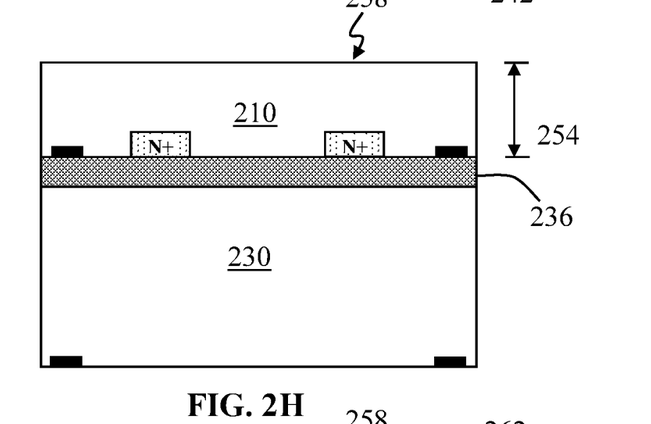

In block 120, a grinding process is applied to the second side 204 of FIG. 2G of the semiconductor device wafer of the bonded wafer 208. A thickness 254 of FIG. 2H of the semiconductor device wafer is reduced. A grinded surface 258 of FIG. 2H is exposed. Block 120 may be followed by block 122.

Figure 2I:
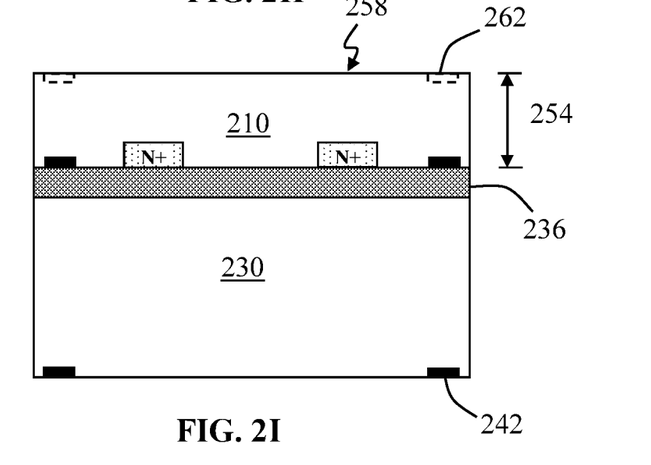

FIG. 2I shows an optional processing step. A (optional) fourth plurality of alignment marks 262 (shown in dashed lines) are formed on the grinded surface 258 by referencing the third plurality of alignment marks 222.

Figure 2J:
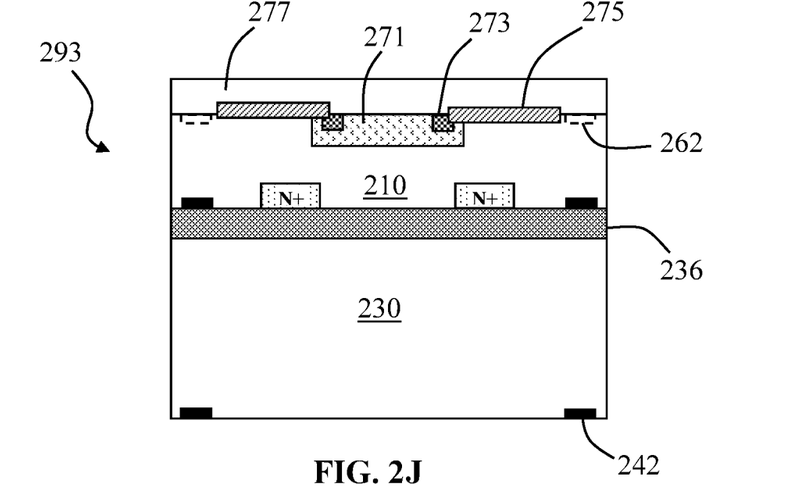

In block 122, a plurality of device structure members are formed on the grinded surface forming a bonded processed wafer 293 of FIG. 2J. The plurality of device structure members include a first plurality of regions 271 of the second conductivity type (for example, P), a second plurality of regions 273 of the first conductivity type (for example, N+), a plurality of source regions 275 and a plurality of gate regions 277.

In examples of the present disclosure, the plurality of device structure members are formed by referencing the fourth plurality of alignment marks 262. Block 122 may be followed by block 124.

Figure 2K:
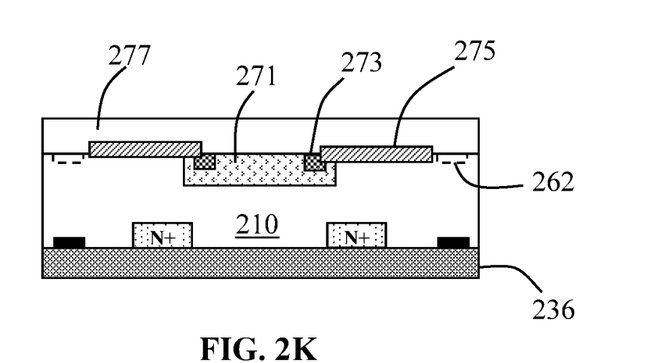
Figure 2L:
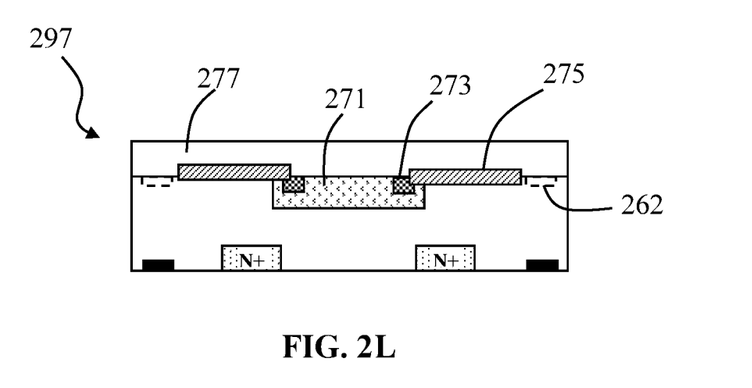

In block 124, the carrier wafer is removed from the bonded processed wafer 293 of FIG. 2J forming a processed wafer 297 of FIG. 2L. In one example, the silicon substrate 230 is removed (for example, be a grinding process) followed by removing the silicon oxide layer 236 of FIG. 2K (for example, by a chemical etching process). Block 124 may be followed by block 126.

Figure 2M:
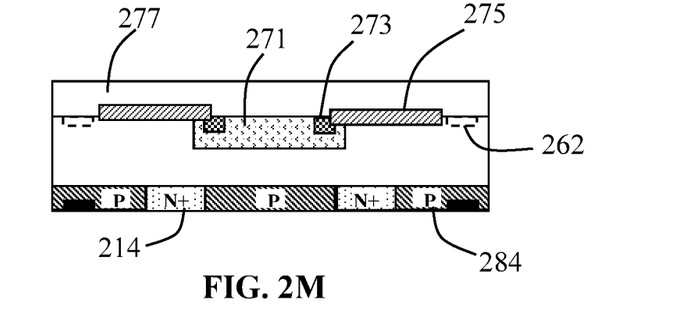

In block 126, an implanting process and an annealing process are applied so as to form a plurality of regions 284 of FIG. 2M of a second conductivity type (for example, P) adjacent to the first pattern 214 of the first conductivity type (for example, N+). In one example, no patterning process is required to form the plurality of regions 284. Block 126 may be followed by block 128.

Figure 2N:
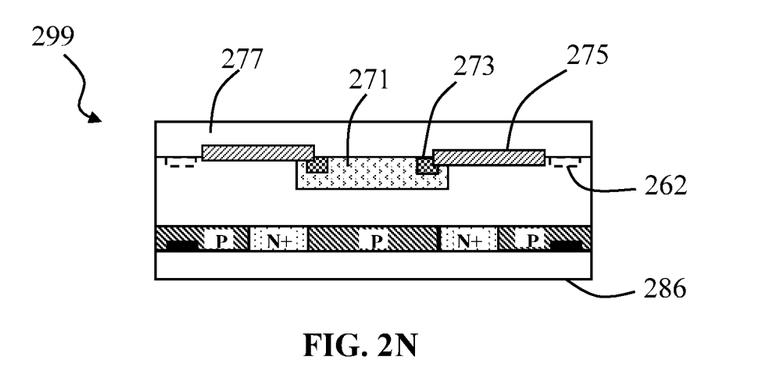

In block 128, a metallization process is applied forming a metallization layer 286 of FIG. 2N of a product wafer 299. Block 128 may be followed by block 130.

Figure 2O:
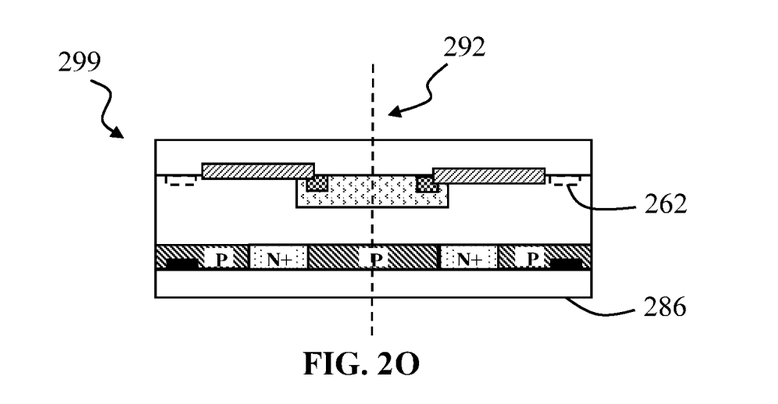

In block 130, a singulation process 292 of FIG. 2O is applied to the product wafer 299 so as to form a plurality of separated semiconductor devices. In examples of the present disclosure, the plurality of separated semiconductor devices are a plurality of reverse conducting insulated-gate bipolar transistors (RC-IGBTs).

Those of ordinary skill in the art may recognize that modifications of the embodiments disclosed herein are possible. For example, a thickness of a carrier wafer may vary. Other modifications may occur to those of ordinary skill in this art, and all such modifications are deemed to fall within the purview of the present invention, as defined by the claims.

The invention claimed is:

1. A method for fabricating semiconductor devices, the method comprising the steps of:
   providing a semiconductor device water comprising a first side and a second side opposite the first side; forming a first plurality of alignment marks on the first side of the semiconductor device wafer;
   forming a first pattern of a first conductivity type on the first side of the semiconductor device wafer by referencing the first plurality of alignment marks;
   forming a second plurality of alignment marks on the second side of the semiconductor device wafer by referencing the first plurality of alignment marks;
   forming a bonded wafer by bonding a carrier wafer to the first side of the semiconductor device wafer, the carrier wafer comprising a bonded side and a free side;
   forming a third plurality of alignment marks on the free side of the carrier wafer by referencing the second plurality of alignment marks;
   applying a grinding process to the second side of the semiconductor device wafer of the bonded wafer reducing a thickness of the semiconductor device wafer and exposing a grinded surface;
   forming a plurality of device structure members on the grinded surface forming a bonded processed wafer;
   removing the carrier wafer from the bonded processed wafer forming a processed wafer;
   applying an implanting process and an annealing process forming a plurality of regions of a second conductivity type on the first side of the semiconductor device wafer adjacent to the first pattern of the first conductivity type; and
   applying a metallization process forming a product wafer;
   wherein the step of forming the first pattern oi the first conductivity type is before the step of forming the bonded wafer;
   wherein the step of forming the second plurality of alignment marks is before the step of forming the bonded wafer;
   wherein the step of forming the bonded wafer is before the step of forming the third plurality of alignment marks; and wherein the step of forming the bonded wafer is before the step of applying the implanting process and the annealing process forming the plurality of regions of the second conductivity type.

2. The method for fabricating semiconductor devices of claim 1, after the step of applying the metallization process, applying a singulation process to the product wafer forming a plurality of separated semiconductor devices.

3. The method for fabricating semiconductor devices of claim 2, wherein the plurality of separated semiconductor devices are a plurality of reverse conducting insulated-gate bipolar transistors.

4. The method for fabricating semiconductor devices of claim 1, wherein the carrier wafer comprises a silicon substrate and a silicon oxide layer;
   wherein the silicon oxide layer is located at the bonded side of the carrier wafer; and
   wherein the step of forming the bonded wafer by bonding the carrier wafer to the first side of the semiconductor device wafer comprises forming the bonded wafer by bonding the silicon oxide layer of the carrier wafer to the first side of the semiconductor device wafer.

5. The method for fabricating semiconductor devices of claim 4, wherein the step of removing the carrier wafer from the bonded processed wafer comprises the sub-steps of
grinding off the silicon substrate of the carrier wafer; and
stripping off the silicon oxide layer of the carrier wafer.

6. The method for fabricating semiconductor devices of claim 1, wherein the semiconductor device wafer comprises a silicon oxide layer located at the first side of the semiconductor device wafer;
wherein the carrier wafer comprises a silicon substrate and a silicon oxide layer;
wherein the silicon oxide layer is located at the bonded side of the carrier wafer; and
wherein the step of forming the bonded wafer by bonding the carrier wafer to the first side of the semiconductor device wafer comprises
forming the bonded wafer by bonding the silicon oxide layer of the carrier wafer to the silicon oxide layer of the semiconductor device wafer.

7. The method for fabricating semiconductor devices of claim 6, wherein the step of removing the carrier wafer from the bonded processed wafer comprises the sub-steps of
grinding off the silicon substrate of the carrier wafer; and
stripping off the silicon oxide layer of the carrier wafer; and
wherein the method for fabricating semiconductor devices further comprises, after the step of removing the carrier wafer from the bonded processed wafer,
stripping off the silicon oxide layer of the semiconductor device wafer.

8. The method for fabricating semiconductor devices of claim 1, wherein the step of forming the plurality of device structure members on the grinded surface comprises the sub-steps of
forming a first plurality of regions of the second conductivity type;
forming a second plurality of regions of the first conductivity type;
forming a plurality of source regions; and
forming a plurality of gate regions.

9. The method for fabricating semiconductor devices of claim 1, before the step of forming the plurality of device structure members on the grinded surface,
forming a fourth plurality of alignment marks on the grinded surface referencing the third plurality of alignment marks.

10. The method for fabricating semiconductor devices of claim 9, wherein the step of forming the plurality of device structure members on the grinded surface comprises the sub-steps of
forming a first plurality of regions of the second conductivity type referencing the fourth plurality of alignment marks;
forming a second plurality of regions of the first conductivity type referencing the fourth plurality of alignment marks;
forming a plurality of source regions referencing the fourth plurality of alignment marks; and
forming a plurality of gate regions referencing the fourth plurality of alignment marks.

11. The method for fabricating semiconductor devices of claim 1, wherein the semiconductor device wafer is a monocrystalline Czochralski silicon wafer.

12. The method for fabricating semiconductor devices of claim 1, wherein the semiconductor device wafer is a magnetic field applied Czochralski silicon wafer.

13. The method for fabricating semiconductor devices of claim 1, wherein the semiconductor device wafer is a floating zone silicon wafer.

14. The method for fabricating semiconductor devices of claim 1, an ASML 3DALIGN machine is used to conduct the step of forming the second plurality of alignment marks on the second side of the semiconductor device wafer by referencing the first plurality of alignment marks.

* * * * *